(12) United States Patent
Roewer

(10) Patent No.: US 11,177,794 B2
(45) Date of Patent: Nov. 16, 2021

(54) OSCILLATOR DEVICE

(71) Applicant: Robert Bosch GmbH, Stuttgart (DE)

(72) Inventor: Falk Roewer, Reutlingen-Betzingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/473,587

(22) PCT Filed: Dec. 15, 2017

(86) PCT No.: PCT/EP2017/083057
§ 371 (c)(1),
(2) Date: Jun. 25, 2019

(87) PCT Pub. No.: WO2018/127384
PCT Pub. Date: Jul. 12, 2018

(65) Prior Publication Data
US 2020/0153419 A1    May 14, 2020

(30) Foreign Application Priority Data
Jan. 4, 2017   (DE) .......................... 102017200054.6

(51) Int. Cl.
| | |
|---|---|
| *H03B 5/04* | (2006.01) |
| *H03L 1/02* | (2006.01) |
| *H03B 5/12* | (2006.01) |
| *H03K 3/03* | (2006.01) |
| *H03K 3/011* | (2006.01) |

(52) U.S. Cl.
CPC .......... *H03K 3/0315* (2013.01); *H03K 3/011* (2013.01)

(58) Field of Classification Search
CPC .............................. H03K 3/0315; H03K 3/011
USPC ........................... 331/108 C, 57, 66, 70, 176
See application file for complete search history.

(56) References Cited

U.S. PATENT DOCUMENTS

| | | | | |
|---|---|---|---|---|
| 4,395,138 A | * | 7/1983 | Chihara | G04C 10/00 368/204 |
| 4,453,834 A | * | 6/1984 | Suzuki | G04G 3/022 331/111 |
| 5,646,428 A | | 7/1997 | Hamada | |
| 6,496,056 B1 | * | 12/2002 | Shoji | H03K 3/011 327/543 |
| 9,641,164 B2 | * | 5/2017 | Tohidian | H03K 5/133 |
| 2014/0327486 A1 | | 11/2014 | Roine et al. | |

FOREIGN PATENT DOCUMENTS

| | | |
|---|---|---|
| EP | 1037388 A2 | 9/2000 |
| EP | 1347575 A1 | 9/2003 |

OTHER PUBLICATIONS

International Search Report for PCT/EP2017/083057, dated May 17, 2018.

* cited by examiner

*Primary Examiner* — Richard Tan
(74) *Attorney, Agent, or Firm* — Norton Rose Fulbright US LLP; Gerard Messina

(57) ABSTRACT

An oscillator device based on a ring oscillator, in which temperature-dependent fluctuations in the frequency of the clock signal of a ring oscillator can be compensated by adapting the supply voltage of the ring oscillator. For this purpose, the supply voltage of the ring oscillator is adapted as a function of an ambient temperature, using a voltage supply circuit.

6 Claims, 1 Drawing Sheet

OSCILLATOR DEVICE

FIELD OF THE INVENTION

The present invention relates to an oscillator device. In particular, the present invention relates to a fast-starting oscillator device having a ring oscillator.

BACKGROUND INFORMATION

Patent document EP 1347575 A1 discusses a method for producing an oscillating signal having the steps of initializing an even-numbered number of inverters chained to one another, so that the outputs of the inverters have, in an alternating manner, a first logical value and a second logical value, and of inputting an excitation pulse into the chain of inverters in order to excite the oscillation, the length of the excitation pulse being smaller than the runtime through the chain of inverters.

Ring oscillators are believed to be understood. Generally, ring oscillators have an odd number of inverting components wired together in a ring configuration. Due to the finite runtime in the individual inverting components, after application of a supply voltage an at least approximately constant oscillation arises. Conventional "free-wheeling" ring oscillators have a very large frequency scatter related to manufacturing process fluctuations and ambient temperature, and are therefore generally not suitable for applications having prespecified clock pulse rates.

In addition, temperature-compensated precision clock pulse generators of various configurations are known. Such precision clock pulse generators generally, however, have a relatively large switching time of more than 10 μs.

For particularly energy-efficient applications, such as sensor interfaces, stable clock rates are required for the I/O register synchronization. For this purpose, immediately after an activation a stable clock signal within a specified frequency range is required.

SUMMARY OF THE INVENTION

The present invention discloses an oscillator device having the features of described herein.

Accordingly, the following is provided:

An oscillator device having a ring oscillator and a voltage supply circuit. The ring oscillator is configured to output a clock signal. In particular, the ring oscillator is configured to output the clock signal if an input voltage is provided at the ring oscillator. The voltage supply circuit is configured to provide a specified input voltage at the ring oscillator. In particular, the voltage supply circuit is configured to adapt the input voltage provided at the ring oscillator as a function of an ambient temperature of the oscillator device.

The present invention is based on the finding that ring oscillators can very quickly output a stable clock signal after the application of a supply voltage. The frequency of the clock signal that is outputted by a ring oscillator is a function of, in addition to the ambient temperature, the applied input voltage of the ring oscillator as well.

An idea of the present invention is therefore to take this finding into account and to compensate temperature-dependent frequency fluctuations of a ring oscillator by adapting the supply voltage at the ring oscillator. For this purpose, it is provided to vary the input voltage at the ring oscillator using a suitable voltage supply circuit in such a way that frequency variations in the ring oscillator due to temperature fluctuations, or fluctuations that may be present as a result of the manufacturing process, can be compensated to the greatest possible extent.

If the input voltage of a ring oscillator is compensated in such a way that temperature fluctuations can be compensated in a wide range, then in this way a temperature-stable circuit can be realized that, after activation, can provide a stable clock signal within a very short time span (a few nanoseconds).

In this way, it is possible to activate electronic circuits that require a clock signal, and to supply them with a stable clock signal, within a very short time span. This enables a very fast activation of the corresponding electronic circuits.

According to a specific embodiment, the ring oscillator includes a plurality of inverters or inverting components coupled to one another in a ring configuration. In particular, the ring oscillator can include an odd number of inverting components or inverters coupled to one another in a ring configuration. Due to the finite runtimes of these inverters, a corresponding oscillation frequency can be produced corresponding to the number of inverters coupled to one another in a ring configuration. Such ring oscillators provide a stable clock rate very quickly after the application of a supply voltage.

According to a specific embodiment, the voltage supply circuit has a cascadable source follower circuit. Such a source follower circuit can very quickly adapt an output-side voltage corresponding to a voltage provided at the input side.

According to a specific embodiment, the source follower circuit includes self-conducting depletion transistors. In particular, the source follower circuit includes so-called "Natural VT" NMOS transistors. A source follower circuit having such transistors can produce, from a provided voltage, the required supply voltage for the ring oscillator with very low impedance. In this way, due to the low impedances and the low (parasitic) capacitances, the ring oscillator can be activated very quickly, within a few nanoseconds. The corresponding output signal of the ring oscillator is thus available almost immediately.

According to a specific embodiment, the voltage supply circuit includes a temperature sensor element. The temperature sensor element is coupled to an input of the source follower circuit. In this way, variations in the temperature of the oscillator device can be immediately regulated out, i.e. compensated, so that the oscillator device can produce a temperature-stable output signal.

According to a specific embodiment, the temperature sensor element includes a series circuit of an emulation of components of the ring oscillator. In particular, the temperature sensor element can include a series circuit of transistors that are realized analogously to the transistors in the ring oscillator. In this way, the temperature-dependent effects of the ring oscillator can be emulated in the voltage supply circuit and thus compensated.

According to a specific embodiment, the oscillator device has a further clock pulse generator. The further clock pulse generator is configured to provide a further clock signal. In particular, the further clock signal can include a clock signal that has a frequency that corresponds precisely, or at least approximately, to the frequency of the ring oscillator. Here, the oscillator device is configured to provide a clock signal from the ring oscillator at least until the further clock pulse generator has achieved steady-state oscillation. In particular, the further clock pulse generator can be a temperature-compensated precision clock generator of any configuration. In this way, at first using the ring oscillator it is possible, after a very short activation time, to provide a clock signal, while the further clock pulse generator has not yet reached a steady state and therefore cannot provide a stable clock signal.

The above embodiments and developments can be combined with one another in any appropriate manner. Further embodiments, developments, and implementations of the present invention also include combinations not explicitly named of features of exemplary embodiments of the present invention described above or in the following. In particular, the person skilled in the art will also add individual aspects, as improvements or supplementation, to the respective base forms of the present invention.

The present invention is explained in more detail below on the basis of the exemplary embodiments indicated in the schematic Figures of the drawings.

DETAILED DESCRIPTION

Figure 1:
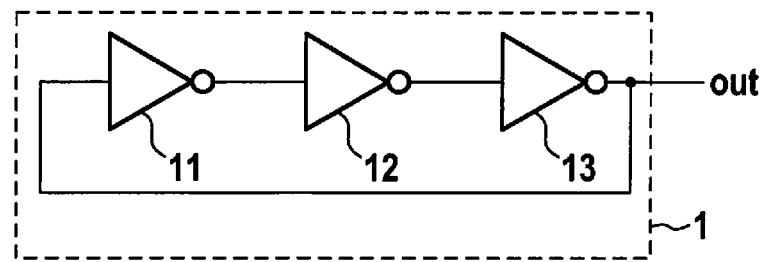
FIG. 1 shows a schematic representation of a ring oscillator according to a specific embodiment of an oscillator device.

FIG. 1 shows a schematic representation of a ring oscillator 1 according to a specific embodiment. In the specific embodiment shown here, ring oscillator 1 includes three inverters 11, 12, and 13, that are connected to one another in a ring configuration. In this context, "ring configuration" means that the output of an inverter 11 or 12 is connected to the input of a subsequent inverter 12 or 13. The output of the last inverter 13 is in turn connected to the input of the first inverter 11. The variant shown here, having only three inverters 11, 12, and 13, is intended only as an illustration. In addition, here an arbitrary number of additional inverters, in particular an arbitrary odd number of inverters, is also possible. Due to the finite runtime of the individual inverters 11, 12, and 13, an oscillation will arise after a supply voltage is applied to ring oscillator 1. This oscillation inside ring oscillator 1 can be tapped and conducted outward, so that the oscillation can be provided to an output out.

Here, the individual inverters 11, 12, and 13 of ring oscillator 1 can for example be realized by transistors, such as field effect transistors. Here, the runtimes in ring oscillator 1 can change as a function of the temperature of ring oscillator 1, so that the frequency of the output signal of ring oscillator 1 has a very strong functional dependence on the temperature of ring oscillator 1.

In addition to the temperature dependence of the frequency of the output signal of ring oscillator 1, the frequency of the output signal is also a function of the magnitude of the supply voltage of ring oscillator 1. In this way, it is possible to completely or at least partly compensate temperature-dependent fluctuations of the frequency of the output signal of ring oscillator 1 by adapting the supply voltage. For this purpose, the supply voltage for ring oscillator 1 can be adapted as a function of the temperature using a suitable voltage supply circuit.

Figure 2:
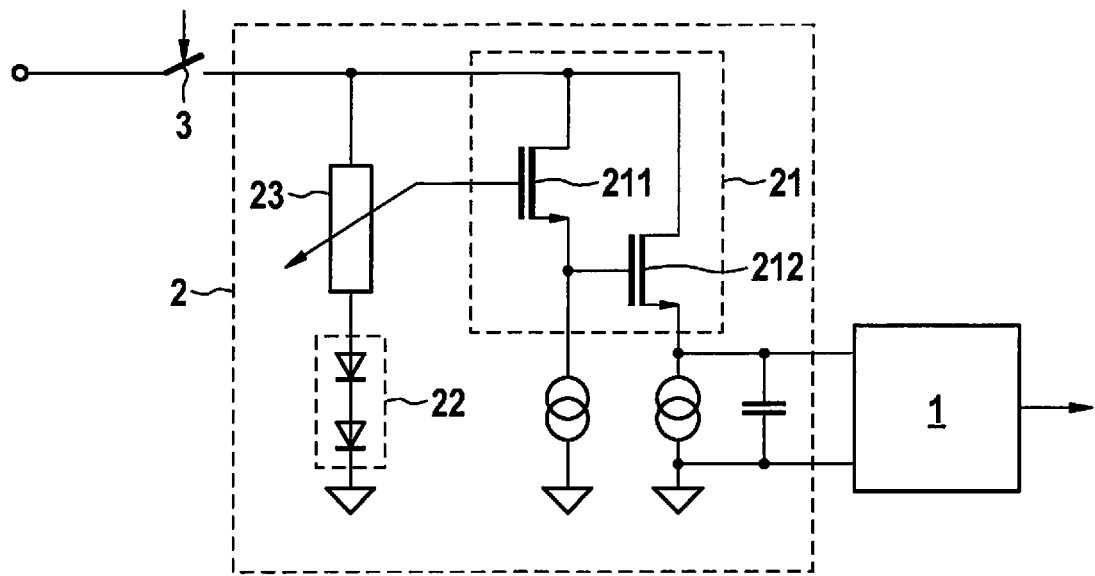
FIG. 2 shows a schematic representation of an oscillator device according to a specific embodiment.

FIG. 2 shows a schematic representation of an oscillator device according to a specific embodiment. The oscillator device includes a ring oscillator 1 and a voltage supply circuit 2. Ring oscillator 1 can for example be a ring oscillator 1 as described above. In addition, of course any other configurations of ring oscillators are also possible. Voltage supply circuit 2 provides a supply voltage to ring oscillator 1, and the magnitude of the supply voltage can be adapted. In particular, supply voltage circuit 2 can adapt the magnitude of the supply voltage for ring oscillator 1 as a function of the ambient temperature of the oscillator device, for example a substrate temperature of a substrate on which the oscillator device is realized.

Here it is a feature of voltage supply circuit 2 that a temperature-compensated input voltage can quickly be applied to ring oscillator 1 after the oscillator device is activated. An activation of the oscillator device can be realized for example by providing a suitable input voltage at the oscillator device. This is indicated in FIG. 2 for example by closing a switch 3.

After the oscillator device is activated, i.e. after, for example, switch 3 is closed and a suitable voltage has been provided at the oscillator device, a temperature-compensated supply voltage is supplied to ring oscillator 1 via a so-called source follower circuit 21. Source follower circuit 21 can for example be a cascaded source follower circuit made up of a plurality of transistors, for example two transistors 211 and 212. In particular, transistors 211 and 212 of source follower circuit 21 can be NVT NMOS transistors (Natural VT=self-conducting depletion NMOS). The source terminals of such transistors can be coupled to a reference potential, for example via a suitable current source. In this way, it is possible to produce a supply voltage having low impedance at ring oscillator 1. Due to the low impedances and the low parasitic capacitances, here the supply voltage at ring oscillator 1 can be provided within a very short time, i.e. within for example a few nanoseconds. Ring oscillator 1 can thereupon immediately provide a clock signal.

Figure 3:
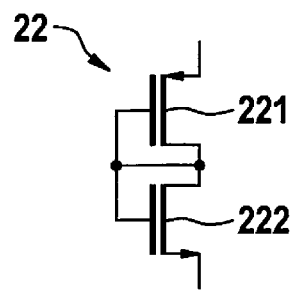
FIG. 3 shows a schematic drawing of a temperature sensor element for an oscillator device according to a specific embodiment.

For the temperature compensation, a temperature-dependent voltage signal can be provided at an input of source follower circuit 21. This temperature-dependent voltage signal can be generated for example by a temperature sensor element 22. In particular, temperature sensor element 22 can here be realized by components that emulate corresponding components of ring oscillator 1. If ring oscillator 1 is realized for example by transistors, then these transistors can be emulated in temperature sensor element 22. In particular, for example transistors can be emulated in temperature sensor element 22 that are also used in ring oscillator 1. For example, for this purpose a PMOS transistor and a NMOS transistor, as also implemented in ring oscillator 1, can be connected in series for temperature sensor element 22. A corresponding series circuit of a PMOS transistor 221 and an NMOS transistor 222 is shown as an example in FIG. 3.

If ring oscillator 1 and voltage supply circuit 2 are realized on a common substrate, then the components of temperature sensor element 22 have the same fluctuations as the components of ring oscillator 1. In this way, production-related variations and tolerances can also be compensated if necessary.

The voltage drop over temperature sensor element 22 can be provided at the input of source follower circuit 21. In particular, here it is possible to provide a voltage drop at the input of source follower circuit 21 via a suitable voltage divider 23. For this purpose, a voltage divider 23 can be provided, for example between a terminal for the input voltage of voltage supply circuit 2 and the temperature sensor element 22, whose center tap is coupled to the input of source follower circuit 21. If voltage divider 23 is a variable voltage divider, then, as needed, using this voltage divider 23 an adjustment can also be carried out in order for example to compensate further production-related fluctuations or other variations and to set the magnitude of the supply voltage for ring oscillator 1 to a suitable level.

The above-described oscillator device makes it possible to provide a stable clock signal within a very short time after the activation of the oscillator device. In particular, it is possible to counteract fluctuations in the frequency of the clock signal due to temperature effects by adapting the input voltage at ring oscillator 1, and to compensate these fluctuations to the greatest possible extent.

Such an oscillator device can be used for example to to make it possible to provide a suitable clock signal immediately after the activation of an electronic circuit. For example, in this way a clock signal can be provided for an interface that, after activation, requires a clock signal in order for example to synchronize I/O registers or to carry out other clock-related operations.

If such a circuit is operated for a longer period of time after activation, then in addition to the above-described temperature-compensated ring oscillator 1, a further clock pulse generator (not shown in the Figures) can be provided. Such a further clock pulse generator can for example be any temperature-compensated precision clock pulse generator, which is trimmed if necessary. Such precision clock pulse generators, however, as a rule require a very large activation time that can be several 10 µs. Such a precision clock pulse generator can provide a stable clock signal only after this relatively long activation time. In this case, the above-described ring oscillator having the voltage supply circuit can provide a clock signal immediately after activation. This clock signal can be generated by ring oscillator 1 until the further clock pulse generator has reached steady-state oscillation and provides a stable clock signal.

In sum, the present invention relates to an oscillator device based on a ring oscillator. Temperature-dependent fluctuations in the frequency of the clock signal of a ring oscillator can be compensated by adapting the supply voltage of the ring oscillator. For this purpose, the supply voltage of the ring oscillator is adapted by a voltage supply circuit as a function of an ambient temperature.

What is claimed is:
1. An oscillator device, comprising:
a ring oscillator to output a clock signal if an input voltage is provided at the ring oscillator;
a voltage supply circuit to provide a specified input voltage at the ring oscillator;
a temperature sensor;
a voltage divider;
two current sources; and
a capacitor,
wherein the voltage supply circuit is configured to adapt the specified input voltage as a function of an ambient temperature of the oscillator device,
a further clock pulse generator to provide a further clock signal;
wherein prior to the further clock pulse generator reaching a steady state, the oscillator device is configured to provide the clock signal of the ring oscillator,
wherein the further clock signal includes a clock signal that has a frequency that corresponds at least approximately to a frequency of the ring oscillator,
wherein the voltage supply circuit includes a cascaded source follower circuit,
wherein an input of the cascaded source follower circuit is coupled to the temperature sensor,
wherein the two current sources are connected to the cascaded source follower circuit, and
wherein the capacitor is connected in parallel with one of the two current sources.
2. The oscillator device of claim 1, wherein the ring oscillator includes a plurality of inverters coupled to one another in a ring configuration.
3. The oscillator device of claim 1, wherein an output of the cascaded source follower circuit is coupled to a voltage supply terminal of the ring oscillator.
4. The oscillator device of claim 1, wherein the cascaded source follower circuit includes self-conducting depletion transistors.
5. The oscillator device of claim 1, wherein the temperature sensor includes a series circuit of an emulation of components of the ring oscillator.
6. The oscillator device of claim 1, wherein the temperature sensor includes a plurality of transistors that are constructed like transistors in the ring oscillator.

* * * * *